(12) United States Patent
Kim

(10) Patent No.: US 11,417,409 B2
(45) Date of Patent: Aug. 16, 2022

(54) ELECTRONIC DEVICES INCLUDING A TEST CIRCUIT AND METHODS OF OPERATING THE ELECTRONIC DEVICES

(71) Applicant: SK hynix Inc., Icheon-si (KR)

(72) Inventor: Hyun Seung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/193,777

(22) Filed: Mar. 5, 2021

(65) Prior Publication Data

US 2022/0122683 A1 Apr. 21, 2022

(30) Foreign Application Priority Data

Oct. 21, 2020 (KR) .......................... 10-2020-0137106

(51) Int. Cl.
| | | |
|---|---|---|
| *G11C 29/00* | (2006.01) | |
| *G11C 29/34* | (2006.01) | |
| *G11C 29/12* | (2006.01) | |
| *G11C 29/36* | (2006.01) | |

(52) U.S. Cl.
CPC .......... *G11C 29/34* (2013.01); *G11C 29/1201* (2013.01); *G11C 29/36* (2013.01); *G11C 2029/3602* (2013.01)

(58) Field of Classification Search
CPC ..... G11C 29/34; G11C 29/1201; G11C 29/36; G11C 2029/3602
See application file for complete search history.

(56) References Cited

U.S. PATENT DOCUMENTS

| | | | |
|---|---|---|---|
| 6,816,422 B2 | 11/2004 | Hamade et al. | |
| 2006/0092755 A1* | 5/2006 | Sato | G01R 31/31928 365/233.5 |
| 2015/0318059 A1* | 11/2015 | Dragula | G11C 29/38 714/719 |
| 2018/0374555 A1* | 12/2018 | Kwon | G11C 29/12015 |

FOREIGN PATENT DOCUMENTS

KR 100520165 B1 10/2005

* cited by examiner

*Primary Examiner* — Mohammed A Bashar
(74) *Attorney, Agent, or Firm* — William Park & Associates Ltd.

(57) ABSTRACT

An electronic device includes a pattern data generation circuit and a data input/output (I/O) circuit. The pattern data generation circuit generates pattern data having a serial pattern based on a command/address signal. The data I/O circuit outputs the pattern data or read data as internal data based on a read command for a read operation and an internal command in a test mode. The data I/O circuit receives and stores the internal data, which are output, as write data for a write operation.

20 Claims, 12 Drawing Sheets

FIG. 11

| OPERATION | TCMD1 | CMD | RD | WT |
|---|---|---|---|---|
| NORMAL MODE | L | H(READ TRAINING) | H(READ) | H(WRITE) |
| FIRST TEST OPERATION | H | H | L | H |
| SECOND TEST OPERATION | H | L | H | H |

ELECTRONIC DEVICES INCLUDING A TEST CIRCUIT AND METHODS OF OPERATING THE ELECTRONIC DEVICES

CROSS-REFERENCE TO RELATED APPLICATIONS

The present application claims priority under 35 U.S.C 119(a) to Korean Application No. 10-2020-0137106, filed on Oct. 21, 2020, which is incorporated herein by references in its entirety.

BACKGROUND

1. Technical Field

Embodiments of the present disclosure relate to electronic devices including a test circuit and methods of operating the electronic devices.

2. Related Art

Semiconductor devices among electronic devices may execute a compressive parallel test to evaluate the performance of a data input/output (I/O) path included in the semiconductor devices. The compressive parallel test corresponds to a test that compresses written data, which are output from memory cells of the semiconductor devices, to detect defects of the data I/O path during a read operation performed after a write operation for data is performed. The compressive parallel test may be executed using a data compression technique that determines whether all of the written data have the same level. Thus, data having a certain sequence have to be received to execute the compressive parallel test. However, when the semiconductor devices execute the compressive parallel test with the data having the certain sequence, it may be difficult to properly detect the defects of the data I/O path.

SUMMARY

According to an embodiment, an electronic device may include a pattern data generation circuit and a data input/output (I/O) circuit. The pattern data generation circuit may be configured to generate pattern data having a serial pattern based on a command/address signal. The data I/O circuit may be configured to output the pattern data or read data as internal data based on a read command for a read operation and an internal command in a test mode. In addition, the data I/O circuit may be configured to receive and store the internal data, which are output, as write data for a write operation. The internal data may be transmitted through a path including a data pad array through which external data are input or output.

According to another embodiment, an electronic device may include a pattern data generation circuit, a data input/output (I/O) circuit, and a defect detection circuit. The pattern data generation circuit may be configured to generate pattern data having a serial pattern based on a command/address signal. The data I/O circuit may be configured to output the pattern data as internal data based on an internal command in a test mode. In addition, the data I/O circuit may be configured to receive and store the internal data, which are output, as write data for a write operation. The defect detection circuit may be configured to generate a test flag signal by comparing the write data with the pattern data during the write operation in the test mode. The internal data are transmitted through a path including a data pad array through which external data are input or output.

According to yet another embodiment, there may be provided a method of operating an electronic device. The method may include generating pattern data and performing a first test operation. The pattern data may be generated to have a serial pattern based on a command/address signal. The first test operation may be performed to store the pattern data as write data for a write operation by transmitting the pattern data through a path including a data pad array based on an internal command and is performed to generate a test flag signal by comparing the write data with the pattern data based on a test command and a write command for the write operation.

BRIEF DESCRIPTION OF THE DRAWINGS

FIG. 11 is a table illustrating operations performed in a normal mode and a test mode of the second electronic device illustrated in FIG. 2.

DETAILED DESCRIPTION

In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

Various embodiments of the present disclosure will be described hereinafter with reference to the accompanying drawings. However, the embodiments described herein are for illustrative purposes only and are not intended to limit the scope of the present disclosure.

Figure 1:
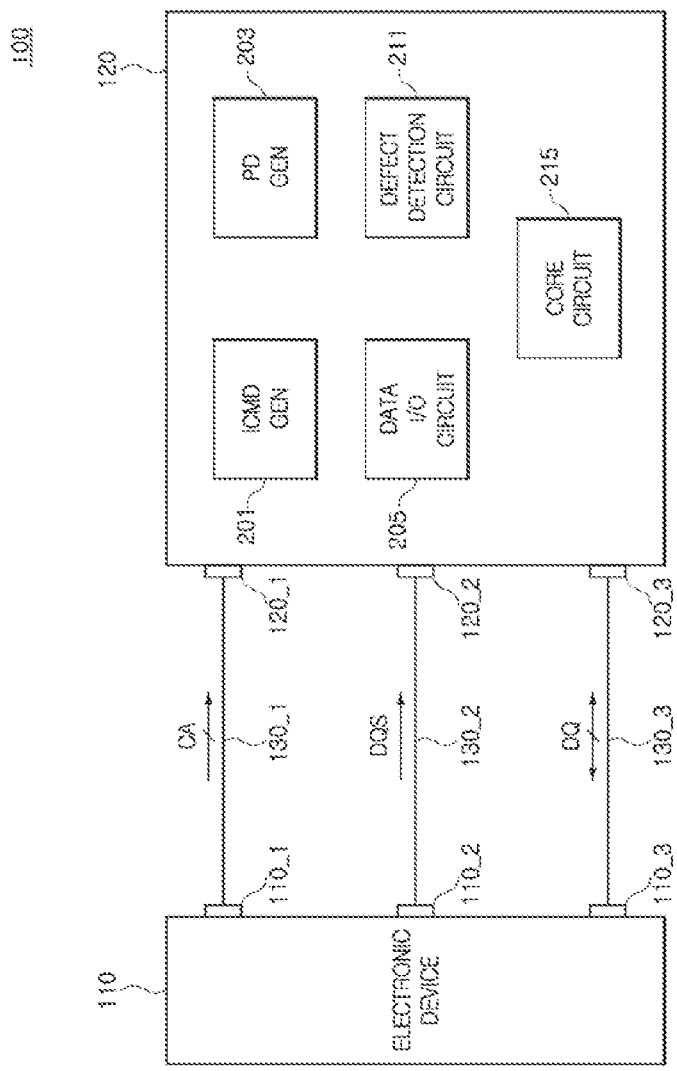
FIG. 1 is a block diagram illustrating a configuration of an electronic system according to an embodiment of the present disclosure.

FIG. 1 is a block diagram illustrating a configuration of an electronic system 100 according to an embodiment of the present disclosure. As illustrated in FIG. 1, the electronic system 100 may include a first electronic device 110 and a second electronic device 120.

The first electronic device 110 may include a first device pin 110_1, a second device pin 110_2, and a third device pin 110_3. The first electronic device 110 may be realized using a controller or a test apparatus. The second electronic device 120 may include a fourth device pin 120_1, a fifth device pin 120_2, and a sixth device pin 120_3. The second electronic device 120 may be realized using a semiconductor device.

The first electronic device 110 may transmit a command and address (command/address) signal CA to the second electronic device 120 through a first transmission line 130_1 coupled between the first device pin 110_1 and the fourth device pin 120_1. The number of bits included in the command/address signal CA may be set to be different according to the embodiments. The first electronic device 110 may transmit a data strobe signal DQS to the second electronic device 120 through a second transmission line 130_2 coupled between the second device pin 110_2 and the fifth device pin 120_2. The first electronic device 110 may transmit external data DQ to the second electronic device 120 through a third transmission line 1303 coupled between the third device pin 110_3 and the sixth device pin 120_3. The first electronic device 110 may receive the external data DQ from the second electronic device 120 through the third transmission line 130_3 coupled between the third device pin 110_3 and the sixth device pin 120_3. The number of bits included in the external data DQ may be set to be different according to the embodiments.

The second electronic device 120 may include an internal command generation circuit (ICMD_GEN) 201, a pattern data generation circuit (PD GEN) 203, a data input/output (I/O) circuit 205, a defect detection circuit 211, and a core circuit 215. The second electronic device 120 may receive the command/address signal CA, the data strobe signal DQS, and the external data DQ from the first electronic device 110 to perform various operations such as a read operation, a write operation, and a read training operation in a normal mode and in a test mode. The data strobe signal DQS may be toggled during a certain period after a read latency period ends when the second electronic device 120 performs the read operation in the normal mode or the test mode. The data strobe signal DQS may be toggled during a certain period after the read latency period ends when the second electronic device 120 performs the read training operation in the normal mode or the test mode. The data strobe signal DQS may be toggled during a certain period when the second electronic device 120 performs the write operation in the normal mode. The data strobe signal DQS may be non-toggled when the second electronic device 120 performs the write operation in the test mode. In an embodiment, a non-toggled signal may be a signal that is maintained at a level without changing to a different level for a predetermined duration of time.

Figure 2:
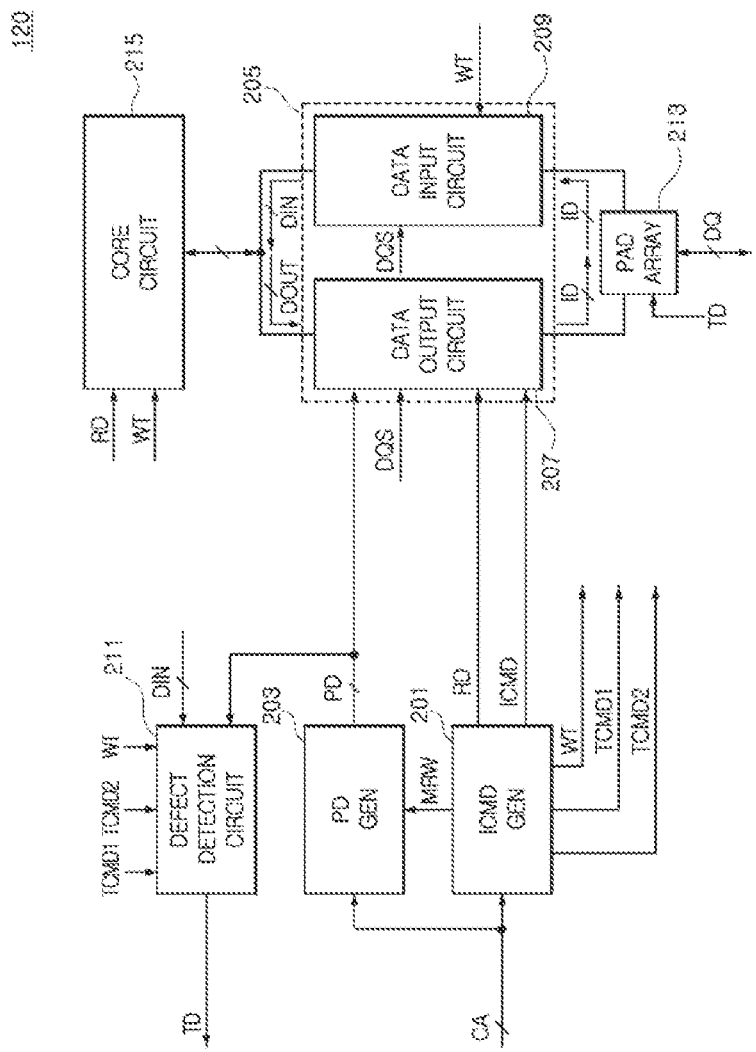
FIG. 2 is a block diagram illustrating a configuration of an example of a second electronic device included in the electronic system illustrated in FIG. 1.

The internal command generation circuit 201 of the second electronic device 120 may receive the command/address signal CA to generate a read command (RD of FIG. 2) for the read operation, a write command (WT of FIG. 2) for the write operation, a test command (TCMD1 of FIG. 2) for the test mode, and an internal command (ICMD of FIG. 2).

The pattern data generation circuit 203 of the second electronic device 120 may generate pattern data (PD of FIG. 2) having a serial pattern based on the command/address signal CA.

The data I/O circuit 205 of the second electronic device 120 may transmit the pattern data PD to a path including a data pad array (213 of FIG. 2) based on the data strobe signal DQS and the internal command ICMD in the test mode to store the pattern data PD into the data I/O circuit 205 as write data (DIN of FIG. 2) and may output the write data DIN stored in the data I/O circuit 205 based on the write command WT. The data I/O circuit 205 of the second electronic device 120 may transmit read data (DOUT of FIG. 2) to the path including the data pad array 213 based on the data strobe signal DQS and the read command RD in the test mode to store the read data DOUT into the data I/O circuit 205 as the write data DIN and may output the write data DIN stored in the data I/O circuit 205 based on the write command WT.

The defect detection circuit 211 of the second electronic device 120 may compare the write data DIN with the pattern data PD to generate a test flag signal (TD of FIG. 2) when the write operation is performed in the test mode. Thus, the second electronic device 120 may compare the write data DIN generated based on the pattern data PD with the pattern data PD having a serial pattern in the test mode, thereby improving the ability of detecting defects which are generated on a data I/O path including the data pad array 213.

The core circuit 215 of the second electronic device 120 may include a memory cell array that stores the write data DIN as stored data when write operation is performed and outputs the stored data as the read data DOUT.

FIG. 2 is a block diagram illustrating a configuration of an example of the second electronic device 120. As illustrated in FIG. 2, the second electronic device 120 may include the internal command generation circuit 201, the pattern data generation circuit 203, the data I/O circuit 205, the defect detection circuit 211, the data pad array 213, and the core circuit 215.

The internal command generation circuit 201 may generate the read command RD, the internal command ICMD, the write command WT, a mode register command MRW, the test command TCMD1, and a test read command TCMD2 based on the command/address signal CA. The internal command generation circuit 201 may generate the read command RD based on the command/address signal CA having a logic level combination for performing the read operation. The read command RD may be activated to perform the read operation. The internal command generation circuit 201 may generate the internal command ICMD based on the command/address signal CA having a logic level combination for performing the read training operation. The internal command ICMD may be activated to perform the read training operation. The internal command generation circuit 201 may generate the write command WT based on the command/address signal CA having a logic level combination for performing the write operation. The write command WT may be activated to perform the write operation. The internal command generation circuit 201 may generate the mode register command MRW based on the command/address signal CA having a logic level combination for performing a mode register write operation. The mode register command MRW may be activated to perform the mode register write operation. The internal command generation circuit 201 may generate the test command TCMD1 based on the command/address signal CA having a logic level combination for executing the test mode. The test command TCMD1 may be activated to execute the test mode. The test command TCMD1 may be inactivated to execute the normal mode. The internal command generation circuit 201 may generate the test read command TCMD2 based on the command/address signal CA having a logic level combination for outputting the test flag signal TD. The test read command TCMD2 may be activated to output the test flag signal TD.

The pattern data generation circuit 203 may generate the pattern data PD having a serial pattern based on the command/address signal CA and the mode register command MRW. The pattern data generation circuit 203 may extract and generate the pattern data PD from the command/address signal CA when the mode register write operation is performed. The pattern data PD may include bits having a serial sequence. The pattern data PD may include a first bit PD<1> and a second bit PD<2>. The number of bits included in the pattern data PD may be set to be different according to the embodiments. The serial pattern of the pattern data PD may be set to be a pattern that at least two of the bits included in the pattern data PD have different logic levels. That is, the first bit PD<1> of the pattern data PD may have a logic level which is different from a logic level of the second bit PD<2> of the pattern data PD. For example, the serial pattern of the pattern data PD may be set to have a logic level combination of 'L, H, L, L, L, L, L, L'. The serial pattern of the pattern data PD may be set to be different according to the embodiments.

The data I/O circuit 205 may include a data output circuit 207 and a data input circuit 209. In the test mode, the data I/O circuit 205 may output the pattern data PD or the read data DOUT as internal data ID based on the data strobe signal DQS, the internal command ICMD, and the read command RD and may receive the internal data ID to store the internal data ID as the write data DIN for the write operation. In the test mode, the data I/O circuit 205 may transmit the internal data ID trough a path including the data pad array 213 transmitting the external data DQ based on the data strobe signal DQS, the internal command ICMD, and the read command RD to store the internal data ID as the write data DIN. The data I/O circuit 205 may output the write data DIN stored therein when the write command WT is activated to perform the write operation.

The data strobe signal DQS may be toggled during a certain period after the read latency period when one of the internal command ICMD and the read command RD is activated in the normal mode or in the test mode. That is, the data strobe signal DQS may be toggled during a certain period after the read latency period when the internal command ICMD is activated in the test mode. The data strobe signal DQS may be toggled during a certain period after the read latency period when the read command RD is activated in the test mode. The data strobe signal DQS may be toggled during a certain period when the write command WT is activated in the normal mode. The data strobe signal DQS may be non-toggled when the write command WT is activated in the test mode.

In the test mode, the data I/O circuit 205 may output the pattern data PD as the internal data ID based on the data strobe signal DQS and the internal command ICMD and may receive the internal data ID to store the internal data ID as the write data DIN for the write operation. When the internal command ICMD is activated in the test mode, the data I/O circuit 205 may be synchronized with the data strobe signal DQS toggled during a certain period after the read latency period to output the pattern data PD as the internal data ID and may receive the internal data ID to store the internal data ID as the write data DIN for the write operation. When the internal command ICMD is activated in the test mode, the data I/O circuit 205 may transmit the internal data ID through a path including the data pad array 213 transmitting the external data DQ in synchronization with the data strobe signal DQS toggled during a certain period after the read latency period to store the internal data ID as the write data DIN.

In the test mode, the data I/O circuit 205 may output the read data DOUT as the internal data ID based on the data strobe signal DQS and the read command RD and may receive the internal data ID to store the internal data ID as the write data DIN for the write operation. When the read command RD is activated in the test mode, the data I/O circuit 205 may be synchronized with the data strobe signal DQS toggled during a certain period after the read latency period to output the read data RD as the internal data ID and may receive the internal data ID to store the internal data ID as the write data DIN for the write operation. When the read command RD is activated in the test mode, the data I/O circuit 205 may transmit the read data DOUT through a path including the data pad array 213 transmitting the external data DQ in synchronization with the data strobe signal DQS toggled during a certain period after the read latency period to store the read data DOUT as the write data DIN.

When the write command WT is activated in the normal mode, the data I/O circuit 205 may receive the internal data ID to generate and output the write data DIN based on the data strobe signal DQS toggled during a certain period. When the write command WT is activated in the test mode, the data I/O circuit 205 may inhibit the internal data ID from being input to the data I/O circuit 205 based on the data strobe signal DQS which is non-toggled.

The data output circuit 207 may be synchronized with the data strobe signal DQS to output the pattern data PD or the read data DOUT as the internal data ID, which are input to the data pad array 213, based on the internal command ICMD and the read command RD. The data output circuit 207 may output the pattern data PD as the internal data ID, which are input to the data pad array 213, in synchronization with the data strobe signal DQS that is toggled during a certain period after the read latency period when the internal command ICMD is activated to perform the read training operation. The data output circuit 207 may output the read data DOUT as the internal data ID, which are input to the data pad array 213, in synchronization with the data strobe signal DQS that is toggled during a certain period after the read latency period when the read command RD is activated to perform the read operation. A configuration and an operation of the data output circuit 207 will be described with reference to FIG. 3 later.

The data input circuit 209 may receive the internal data ID from the data pad array 213 based on the data strobe signal DQS and the write command WT to generate the write data DIN. The data input circuit 209 may receive the internal data ID from the data pad array 213 based on the data strobe signal DQS to store the internal data ID as the write data DIN. When one of the internal command ICMD and the read command RD is activated in the test mode, the data input circuit 209 may generate internal write data (IDIN of FIG. 5) from the internal data ID in synchronization with the data strobe signal DQS toggled during a certain period after the read latency period. When the write command WT is activated in the normal mode, the data input circuit 209 may generate the internal write data IDIN from the internal data ID in synchronization with the data strobe signal DQS toggled during a certain period. The data input circuit 209 may store the internal write data IDIN as the write data DIN. The data input circuit 209 may output the internal write data IDIN stored therein when the write command WT is activated to perform the write operation. When the write command WT is activated in the test mode, the data input circuit 209 may inhibit the internal data ID from being input to the data input circuit 209 based on the data strobe signal DQS which is non-toggled. A configuration and an operation of the data input circuit 209 will be described with reference to FIG. 5 later.

The defect detection circuit 211 may generate the test flag signal TD by comparing the write data DIN with the pattern data PD based on the test command TCMD1, the test read command TCMD2, and the write command WT. The write data DIN may include first write data (DIN1 of FIG. 7) and second write data (DIN2 of FIG. 7). The first write data DIN1 may include a plurality of bits having a serial sequence. The second write data DIN2 may also include a plurality of bits having a serial sequence. The defect detection circuit 211 may generate and store the test flag signal TD by comparing the write data DIN with the pattern data PD based on the test command TCMD1 and the write command WT when the write operation is performed in the test mode. The defect detection circuit 211 may generate and store the test flag signal TD by comparing a logic level combination of the write data DIN with a logic level combination of the pattern data PD based on the test command TCMD1 and the write command WT when the write operation is performed in the test mode. For example, the defect detection circuit 211 may compare a logic level combination of the first write data DIN1 with a logic level combination of the pattern data PD when the write operation is performed in the test mode. In addition, the defect detection circuit 211 may also compare a logic level combination of the second write data DIN2 with a logic level combination of the pattern data PD when the write operation is performed in the test mode. The test flag signal TD may have a first logic level when the write data DIN and the pattern data PD have the same logic level combination. The test flag signal TD may have a second logic level when the write data DIN and the pattern data PD have different logic level combinations. That is, when the test flag signal TD has a first logic level, it means that the data I/O path has no defect. In contrast, when the test flag signal TD has a second logic level, it means that the data I/O path has defect. In an embodiment, the first logic level is set as a logic "low" level, and the second logic level is set as a logic "high" level. The defect detection circuit 211 may output the test flag signal TD, which is stored therein, based on the test read command TCMD2. The defect detection circuit 211 may output the test flag signal TD, which is stored therein, when the test read command TCMD2 is activated. The number of the test flag signal TD may be set to be different according to the embodiments. Thus, the defect detection circuit 211 may compare the write data DIN generated based on the pattern data PD with the pattern data PD having a serial pattern in the test mode, thereby improving the ability of detecting defects which are generated on a data I/O path including the data pad array 213. A configuration and an operation of the defect detection circuit 211 will be described with reference to FIG. 6 later.

The data pad array 213 may communicate with the first electronic device (110 of FIG. 1) by outputting the external data DQ to the first electronic device 110 or receiving the external data DQ from the first electronic device 110. The external data DQ may include first external data (not shown) and second external data (not shown). The first external data may include a plurality bits having a serial sequence. The second external data may also include a plurality bits having a serial sequence. The data pad array 213 may include a plurality of pads, for example, a first data pad and a second data pad. The data pad array 213 may output the first external data to the first electronic device 110 through the first data pad or may receive the first external data from the first electronic device 110 through the first data pad. The data pad array 213 may output the second external data to the first electronic device 110 through the second data pad or may receive the second external data from the first electronic device 110 through the second data pad. The number of bits included in the external data DQ may be set to be different according to the embodiments. The data pad array 213 may output the internal data ID to the data I/O circuit 205 or may receive the internal data ID from the data I/O circuit 205. The internal data ID may include first internal data (not shown) and second internal data (not shown). The first internal data may include a plurality of bits having a serial sequence. The second internal data may also include a plurality of bits having a serial sequence. The data pad array 213 may output the first internal data to the data I/O circuit 205 through the first data pad or may receive the first internal data from the data I/O circuit 205 through the first data pad. The data pad array 213 may output the second internal data to the data I/O circuit 205 through the second data pad or may receive the second internal data from the data I/O circuit 205 through the second data pad. The number of bits included in the internal data ID may be set to be different according to the embodiments. The data pad array 213 may receive the test flag signal TD from the defect detection circuit 211 to output the external data DQ when the test read command TCMD2 is activated. For example, when the test read command TCMD2 is activated, the data pad array 213 may receive the test flag signal TD from the defect detection circuit 211 through the first data pad to output the first external data. The data pad array 213 may receive a power source voltage VDD and a ground voltage VSS through power pads (not shown). The data pad array 213 may be a short circuit abnormally connected to a terminal of the power source voltage VDD or a terminal of the ground voltage VSS due to process defects. For example, when the data pad array 213 is abnormally connected to the terminal of the power source voltage VDD and receives the internal data ID having a logic level combination of 'H,H,H,H,H,H,H,H', the data pad array 213 may output the internal data ID having a logic level combination of 'H,H,H,H,H,H,H,H' as the internal data ID. That is, when the electronic device tests the data I/O path with data having a certain sequence, it may be difficult to detect the defects of the data I/O path. In contrast, when the data pad array 213 is abnormally connected to the terminal of the power source voltage VDD and receives the internal data ID having a logic level combination of 'L,H,L,H,L,H,L,H', the data pad array 213 may output the internal data ID having a logic level combination of 'H,H,H,H,H,H,H,H' as the internal data ID. That is, when the electronic device tests the data I/O path with data having the serial pattern, it may detect the defects of the data I/O path.

The core circuit 215 may include a memory cell array. When the write operation is performed based on the write command WT, the core circuit 215 may receive the write data DIN to store the write data DIN into the memory cell array as the stored data. When the read operation is performed based on the read command RD, the core circuit 215 may output the stored data in the memory cell array as the read data DOUT.

Figure 3:
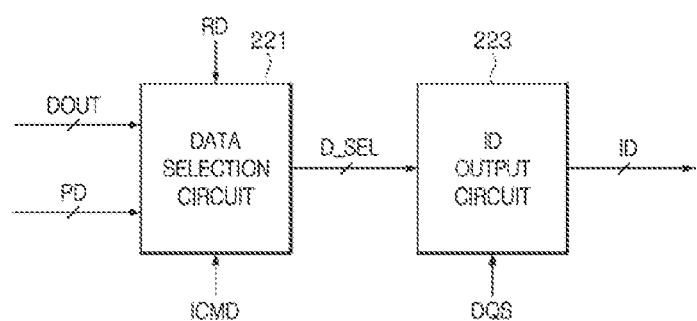
FIG. 3 is a block diagram illustrating a configuration of an example of a data output circuit included in the second electronic device illustrated in FIG. 2.

FIG. 3 is a block diagram illustrating a configuration of the data output circuit 207. As illustrated in FIG. 3, the data output circuit 207 may include a data selection circuit 221 and an internal data output circuit 223.

The data selection circuit 221 may output the read data DOUT or the pattern data PD as selected data D_SEL based on the read command RD and the internal command ICMD. The data selection circuit 221 may output the read data DOUT as the selected data D_SEL when the read command RD is activated for the read operation. The data selection circuit 221 may output the pattern data PD as the selected data D_SEL when the internal command ICMD is activated for the read training operation. The number of bits included in the pattern data PD may be equal to the number of bits included in the read data DOUT. A configuration and an operation of the data selection circuit 221 will be described with reference to FIG. 4 later.

The internal data output circuit 223 may output the selected data D_SEL as the internal data ID in synchronization with the data strobe signal DQS toggled during a certain period after the read latency period when one of the internal command ICMD and the read command RD is activated. The internal data output circuit 223 may serialize the selected data D_SEL, which are input in parallel, to output the serialized data of the selected data D_SEL as the internal data ID.

Figure 4:
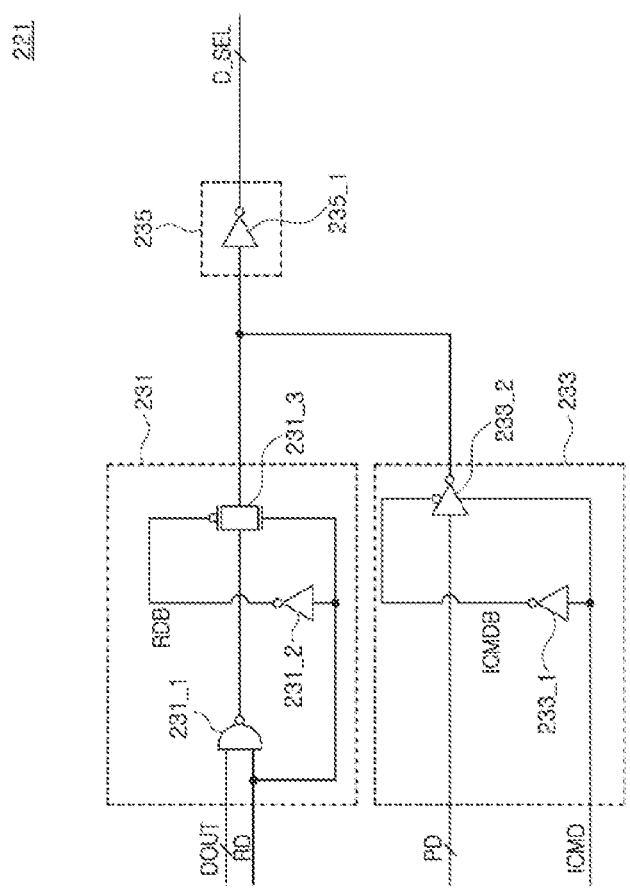
FIG. 4 is a circuit diagram illustrating a configuration of an example of a data selection circuit included in the data output circuit illustrated in FIG. 3.

FIG. 4 is a circuit diagram illustrating a configuration of the data selection circuit 221. As illustrated in FIG. 4, the data selection circuit 221 may include a read data input circuit 231, a pattern data input circuit 233, and a buffer 235.

The read data input circuit 231 may inversely buffer the read data DOUT to output the inversely buffered data of the read data DOUT when the read data RD is activated for the read operation. The read data input circuit 231 may include a NAND gate 2311, an inverter 231_2, and a transfer gate 231_3. The NAND gate 231_1 may inversely buffer the read data DOUT when the read command RD is activated to have a logic "high" level. The inverter 231_2 may inversely buffer the read command RD to generate an inverted read command RDB. The transfer gate 231_3 may output an output signal of the NAND gate 231_1 when the read command RD is activated to have a logic "high" level and the inverted read command RDB is inactivated to have a logic "low" level.

The pattern data input circuit 233 may inversely buffer the pattern data PD to output the inversely buffered data of the pattern data PD when the internal command ICMD is activated for the read training operation. The pattern data input circuit 233 may include inverters 233_1 and 233_2. The inverter 233_1 may inversely buffer the internal command ICMD to generate an inverted internal command ICMDB. The inverter 2332 may inversely buffer the pattern data PD to output the inversely buffered data of the pattern data PD when the internal command ICMD is activated to have a logic "high" level and the inverted internal command ICMDB is inactivated to have a logic "low" level.

The buffer circuit 235 may inversely buffer an output signal of the read data input circuit 231 to generate the selected data D_SEL. The buffer circuit 235 may inversely buffer an output signal of the pattern data input circuit 233 to generate the selected data D_SEL. The buffer circuit 235 may include an inverter 235_1.

Figure 5:
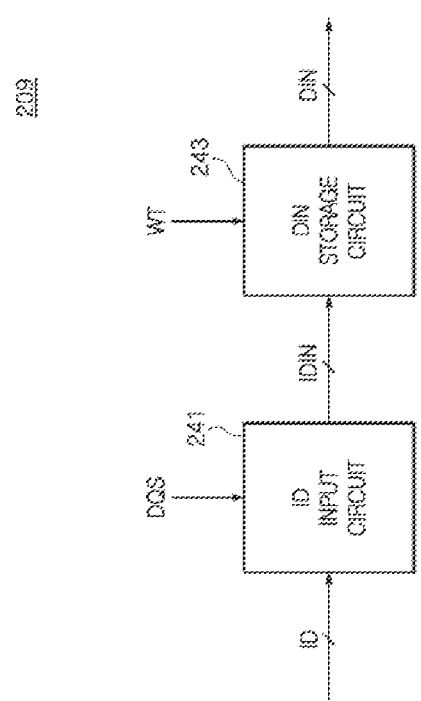
FIG. 5 is a block diagram illustrating a configuration of an example of a data input circuit included in the second electronic device illustrated in FIG. 2.

FIG. 5 is a block diagram illustrating a configuration of the data input circuit 209. As illustrated in FIG. 5, the data input circuit 209 may include an internal data input circuit 241 and a write data storage circuit 243.

The internal data input circuit 241 may generate the internal write data IDIN from the internal data ID based on the data strobe signal DQS. The internal write data IDIN may include first internal write data (IDIN1 of FIG. 10) and second internal write data (not shown). The first internal write data IDIN1 may be generated from the first internal data. The second internal write data may be generated from the second internal data. The internal data input circuit 241 may output the internal data ID as the internal write data IDIN in synchronization with the data strobe signal DQS toggled during a certain period after the read latency period when one of the read command RD and the internal command ICMD is activated in the test mode. That is, the internal data input circuit 241 may output the internal data ID as the internal write data IDIN in synchronization with the data strobe signal DQS toggled during a certain period after the read latency period when the internal command ICMD is activated in the test mode. The internal data input circuit 241 may output the internal data ID as the internal write data IDIN in synchronization with the data strobe signal DQS toggled during a certain period after the read latency period when the read command RD is activated in the test mode. The internal data input circuit 241 may output the internal data ID as the internal write data IDIN in synchronization with the data strobe signal DQS toggled during a certain period when the write command WT is activated in the normal mode. The internal data input circuit 241 may inhibit the internal data ID from being input to the internal data input circuit 241 based on the data strobe signal DQS, which is non-toggled, when the write command WT is activated in the test mode. The internal data input circuit 241 may parallelize the internal data ID, which are input in series, to generate and output the internal write data IDIN.

The write data storage circuit 243 may receive the internal write data IDIN to store the internal write data IDIN as the write data DIN. The write data storage circuit 243 may output the write data DIN, which are stored therein, based on the write command WT. The write data storage circuit 243 may output the write data DIN, which are stored therein, when the write command WT is activated for the write operation.

Figure 6:
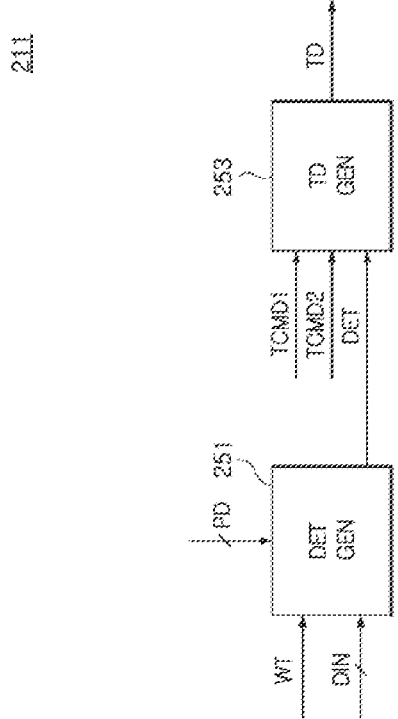
FIG. 6 is a block diagram illustrating a configuration of an example of a defect detection circuit included in the second electronic device illustrated in FIG. 2.

FIG. 6 is a block diagram illustrating a configuration of the defect detection circuit 211. As illustrated in FIG. 6, the defect detection circuit 211 may include a detection signal generation circuit (DET GEN) 251 and a test flag generation circuit (TD GEN) 253.

The detection signal generation circuit 251 may compare the write data DIN with the pattern data PD based on the write command WT to generate a detection signal DET. The detection signal generation circuit 251 may compare a logic level combination of the write data DIN with a logic level combination of the pattern data PD to generate the detection signal DET when the write operation is performed. The detection signal generation circuit 251 may generate the detection signal DET which is activated when a logic level combination of the write data DIN is different from a logic level combination of the pattern data PD during the write operation. The detection signal generation circuit 251 may generate the detection signal DET which is inactivated when a logic level combination of the write data DIN is the same as a logic level combination of the pattern data PD during the write operation. A configuration and an operation of the detection signal generation circuit 251 will be described with reference to FIG. 7 later.

The test flag generation circuit 253 may generate the test flag signal TD from the detection signal DET based on the test command TCMD1 and the test read command TCMD2. The test flag generation circuit 253 may generate and store the test flag signal TD having a first logic level when the test command TCMD1 is activated and the detection signal DET is inactivated in the test mode. The test flag generation circuit 253 may generate and store the test flag signal TD having a second logic level when the test command TCMD1 is activated and the detection signal DET is activated in the test mode. The test flag generation circuit 253 may generate and store the test flag signal TD having the first logic level when the test command TCMD1 is inactivated in the normal mode. The test flag generation circuit 253 may output the test flag signal TD, which is stored therein, when the test read command TCMD2 is activated. A configuration and an operation of the test flag generation circuit 253 will be described with reference to FIG. 9 later.

Figure 7:
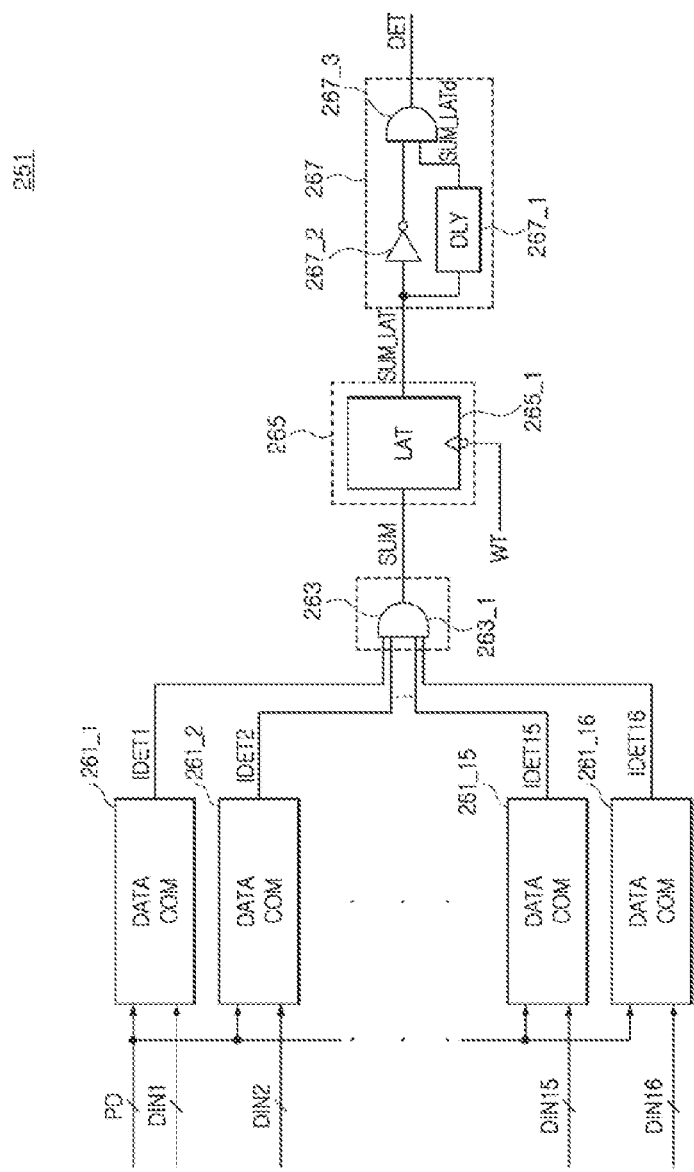
FIG. 7 illustrates a configuration of an example of a detection signal generation circuit included in the defect detection circuit illustrated in FIG. 6.

FIG. 7 illustrates a configuration of the detection signal generation circuit 251. As illustrated in FIG. 7, the detection signal generation circuit 251 may include a plurality of data comparison circuits (DATA COM) (e.g., first to sixteenth data comparison circuits 261_1~261_16), a signal synthesis circuit 263, a synthesized signal latch circuit 265, and a pulse generation circuit 267.

The first data comparison circuit 261_1 may compare a logic level combination of the first write data DIN1 with a logic level combination of the pattern data PD to generate a first internal detection signal IDET1. The first data comparison circuit 261_1 may generate the first internal detection signal IDET1 which is activated to have a logic "low" level when the first write data DIN1 and the pattern data PD have different logic level combinations. The first data comparison circuit 261_1 may generate the first internal detection signal IDET1 which is inactivated to have a logic "high" level when the first write data DIN1 and the pattern data PD have the same logic level combination. Each of the second to sixteenth data comparison circuits 261_2~261_16 may be realized to have the same configuration as the first data comparison circuit 261_1. Thus, detailed descriptions of the second to sixteenth data comparison circuits 261_2~261_16 will be omitted hereinafter to avoid duplicate explanation. A configuration and an operation of the first data comparison circuit 261_1 will be described with reference to FIG. 8 later.

The signal synthesis circuit 263 may synthesize a plurality of internal detection signals (i.e., the first to sixteenth internal detection signals IDET1~IDET16) to generate a synthesized signal SUM. The signal synthesis circuit 263 may generate the synthesized signal SUM which is inactivated to have a logic "high" level when all of the first to sixteenth internal detection signals IDET1~IDET16 are inactivated to have a logic "high" level. The signal synthesis circuit 263 may generate the synthesized signal SUM which is activated to have a logic "low" level when at least one of the first to sixteenth internal detection signals IDET1~IDET16 is activated to have a logic "low" level. The signal synthesis circuit 263 may be realized to include an AND gate 263_1.

The synthesized signal latch circuit 265 may latch the synthesized signal SUM based on the write command WT to generate a latched synthesis signal SUM_LAT. The synthesized signal latch circuit 265 may latch the synthesized signal SUM in synchronization with a falling edge of the write command WT to output the latched signal of the synthesized signal SUM as the latched synthesis signal SUM_LAT. The synthesized signal latch circuit 265 may be realized to include a latch circuit (LAT) 265_1.

The pulse generation circuit 267 may generate the detection signal DET based on the latched synthesis signal SUM_LAT. The pulse generation circuit 267 may generate the detection signal DET which is activated to have a logic "high" level when the latched synthesis signal SUM_LAT is activated to have a logic "low" level. The pulse generation circuit 267 may delay the latched synthesis signal SUM_LAT by a predetermined delay period to generate a delayed latch synthesis signal SUM_LATd. The pulse generation circuit 267 may generate the detection signal DET based on the latched synthesis signal SUM_LAT and the delayed latch synthesis signal SUM_LATd. The pulse generation circuit 267 may generate the detection signal DET which is activated to have a logic "high" level while the delayed latch synthesis signal SUM_LATd is inactivated to have a logic "high" level when the latched synthesis signal SUM_LAT is activated to have a logic "low" level. The pulse generation circuit 267 may include a delay circuit (DLY) 267_1, an inverter 267_2, and an AND gate 267_3. The delay circuit 267_1 may delay the latched synthesis signal SUM_LAT by the predetermined delay period to generate the delayed latch synthesis signal SUM_LATd. The inverter 267_2 may receive an inversely buffer the latched synthesis signal SUM_LAT. The AND gate 267_3 may perform a logical AND operation for the delayed latch synthesis signal SUM_LATd and an output signal of the inverter 267_2 to generate the detection signal DET.

Figure 8:
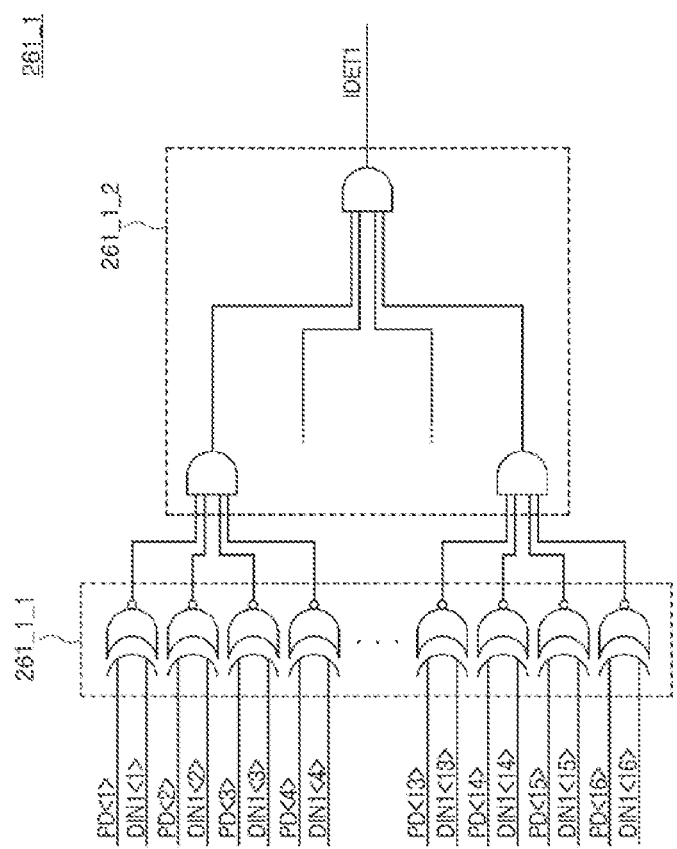
FIG. 8 is a circuit diagram illustrating a configuration of an example of a first data comparison circuit included in the detection signal generation circuit illustrated in FIG. 7.

FIG. 8 is a circuit diagram illustrating a configuration of the first data comparison circuit 261_1. As illustrated in FIG. 8, the first data comparison circuit 261_1 may include an internal comparison circuit 261_1_1 and an internal detection signal generation circuit 261_1_2.

The internal comparison circuit 261_1_1 may compare a logic level combination of the first write data DIN1 with a logic level combination of the pattern data PD to output a signal corresponding to the comparison result. The internal comparison circuit 261_1_1 may be realized to include a plurality of exclusive NOR gates, for example, first to sixteenth exclusive NOR gates. In such a case, the first exclusive NOR gate may output a signal having a logic "high" level when a first bit PD<1> of the pattern data PD and a first bit DIN1<1> of the first write data DIN1 have the same logic level, and the second exclusive NOR gate may output a signal having a logic "high" level when a second bit PD<2> of the pattern data PD and a second bit DIN1<2> of the first write data DIN1 have the same logic level. Similarly, the sixteenth exclusive NOR gate may output a signal having a logic "high" level when a sixteenth bit PD<16> of the pattern data PD and a sixteenth bit DIN1<16> of the first write data DIN1 have the same logic level. Thus, the internal comparison circuit 261_1_1 may output eight signals having a logic "high" level when the pattern data PD and the first write data DIN1 have the same logic level combination. Alternatively, the internal comparison circuit 261_1_1 may output at least one signal having a logic "low" level when the pattern data PD and the first write data DIN1 have different logic level combinations.

The internal detection signal generation circuit 261_1_2 may synthesize output signals of the internal comparison circuit 261_1_1 to generate the first internal detection signal IDET1. For example, the internal detection signal generation circuit 261_1_2 may generate the first internal detection signal IDET1 having a logic "high" level when all of the output signals of the internal comparison circuit 261_1_1 have a logic "high" level. The internal detection signal generation circuit 261_1_2 may generate the first internal detection signal IDET1 having a logic "low" level when at least one of the output signals of the internal comparison circuit 261_1_1 have a logic "low" level. The internal detection signal generation circuit 261_1_2 may be realized to include a plurality of AND gates.

Figure 9:
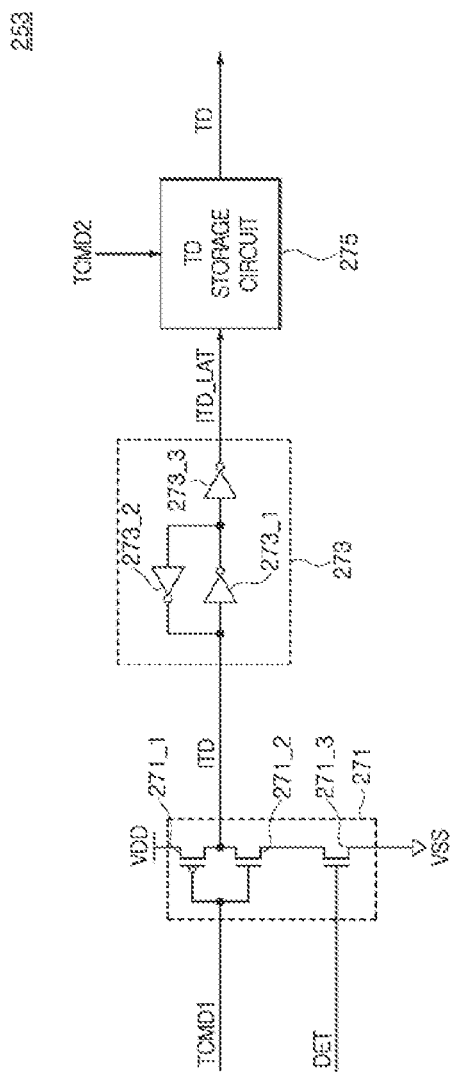
FIG. 9 illustrates a configuration of a configuration of an example of a test flag generation circuit included in the defect detection circuit illustrated in FIG. 6.

FIG. 9 illustrates a configuration of the test flag generation circuit 253. As illustrated in FIG. 9, the test flag generation circuit 253 may include an internal test flag generation circuit 271, an internal test flag latch circuit 273, and a test flag storage circuit 275.

The internal test flag generation circuit 271 may generate an internal test flag signal ITD based on the test command TCMD1 and the detection signal DET. The internal test flag generation circuit 271 may generate the internal test flag signal ITD which is activated to have a logic "low" level when the detection signal DET is activated to have a logic "high" level while the test command TCMD1 is activated to have a logic "high" level in the test mode. The internal test flag generation circuit 271 may generate the internal test flag signal ITD which is inactivated to have a logic "high" level when the test command TCMD1 is inactivated to have a logic "low" level in the normal mode. The internal test flag generation circuit 271 may inhibit the detection signal DET from being input to the internal test flag generation circuit 271 when the test command TCMD1 is inactivated to have a logic "low" level in the normal mode. The internal test flag generation circuit 271 may be realized to include a PMOS transistor 271_1, an NMOS transistor 271_2, and an NMOS transistor 271_3 which are coupled in series between the terminal of the power source voltage VDD and the terminal of the ground voltage VSS. The PMOS transistor 271_1 may pull up a level of the internal test flag signal ITD to the power source voltage VDD when the test command TCMD1 is inactivated to have a logic "low" level. The NMOS transistor 271_2 may be turned on when the test command TCMD1 is activated to have a logic "high" level. The NMOS transistor 271_3 may pull down the level of the internal test flag signal ITD to the ground voltage VSS when the NMOS transistor 271_2 is turned on and the detection signal DET is activated to have a logic "high" level.

The internal test flag latch circuit 273 may latch the internal test flag signal ITD to generate an internal latched test flag signal ITD_LAT. The internal test flag latch circuit 273 may latch the internal test flag signal ITD to output the latched signal of the internal test flag signal ITD as the internal latched test flag signal ITD_LAT. The internal test flag latch circuit 273 may be realized to include inverters 273_1, 273_2, and 273_3. The inverter 273_1 may inversely buffer the internal test flag signal ITD. The inverter 273_2 may inversely buffer an output signal of the inverter 273_1 to output the inversely buffered signal of the output signal of the inverter 273_1 to an input terminal of the inverter 273_1. The inverter 2733 may inversely buffer the output signal of the inverter 2731 to generate the internal latched test flag signal ITD_LAT.

The test flag storage circuit 275 may generate and store the test flag signal TD based on the internal latched test flag signal ITD_LAT. The test flag storage circuit 275 may generate the test flag signal TD by inverting a logic level of the internal latched test flag signal ITD_LAT. The test flag storage circuit 275 may output the test flag signal TD, which is stored therein, based on the test read command TCMD2. The test flag storage circuit 275 may output the test flag signal TD, which is stored therein, when the test read command TCMD2 is activated.

Figure 10:
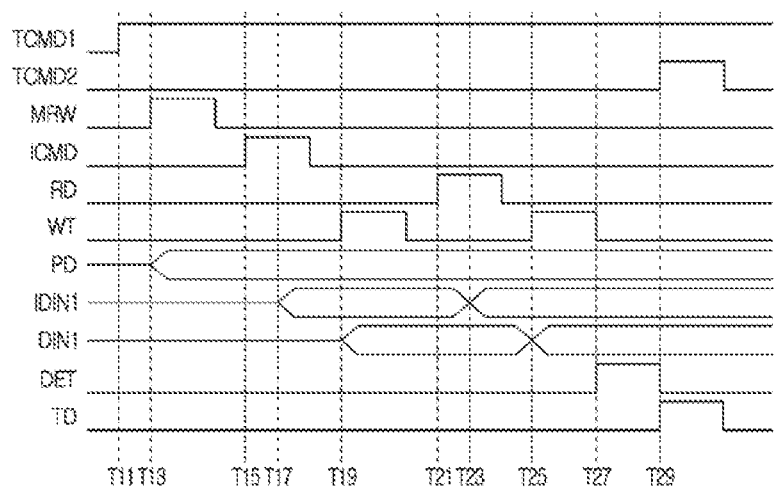
FIG. 10 is a timing diagram illustrating an operation for generating a test flag signal in the second electronic device illustrated in FIG. 2.

FIG. 10 is a timing diagram illustrating an operation for generating the test flag signal TD in the second electronic device 120 illustrated in FIG. 2.

At a point in time "T11", the internal command generation circuit 201 may generate the test command TCMD1 which is activated based on the command/address signal CA having a logic level combination for executing the test mode.

At a point in time "T13", the internal command generation circuit 201 may generate the mode register command MRW which is activated based on the command/address signal CA having a logic level combination for performing the mode register write operation.

At the point in time "T13", the pattern data generation circuit 203 may generate the pattern data PD having a serial pattern from the command/address signal CA based on the mode register command MRW which is activated.

At a point in time "T15", the internal command generation circuit 201 may generate the internal command ICMD which is activated based on the command/address signal CA having a logic level combination for performing the read training operation.

At a point in time "T17", the data I/O circuit 205 may be synchronized with the data strobe signal DQS to output the pattern data PD as the internal data ID based on the internal command ICMD and may receive the internal data ID to generate the first internal write data IDIN1. At the point in time "T17", the data strobe signal DQS may be toggled during a certain period after the read latency period. At the point in time "T17", the data I/O circuit 205 may store the first internal write data IDIN1 as the first write data DIN1.

At a point in time "T19", the internal command generation circuit 201 may generate the write command WT which is activated based on the command/address signal CA having a logic level combination for performing the write operation.

At the point in time "T19", the data I/O circuit 205 may output the first write data DIN1, which are stored therein, based on the write command WT which is activated. At the point in time "T19", the data I/O circuit 205 may inhibit the internal data ID from being input to the data I/O circuit 205 based on the data strobe signal DQS which is non-toggled.

At the point in time "T19", the defect detection circuit 211 may compare a logic level combination of the first write data DIN1 with a logic level combination of the pattern data PD.

The defect detection circuit 211 may generate the detection signal DET which is inactivated when the first write data DIN1 and the pattern data PD have the same logic level combination.

At the point in time "T19", the core circuit 215 may store the first write data DIN1 into the memory cell array as the stored data based on the write command WT which is activated.

At a point in time "T21", the internal command generation circuit 201 may generate the read command RD which is activated based on the command/address signal CA having a logic level combination for performing the read operation.

At the point in time "T21", the core circuit 215 may output the stored data in the memory cell array as the read data DOUT based on the read command RD which is activated.

At a point in time "T23", the data I/O circuit 205 may be synchronized with the data strobe signal DQS to output the read data DOUT as the internal data ID based on the read command RD which is activated and may receive the internal data ID to generate the first internal write data IDIN1. At the point in time "T23", the data strobe signal DQS may be toggled during a certain period after the read latency period. At the point in time "T23", the data I/O circuit 205 may store the first internal write data IDIN1 as the first write data DIN1.

At a point in time "T25", the internal command generation circuit 201 may generate the write command WT which is activated based on the command/address signal CA having a logic level combination for performing the write operation.

At the point in time "T25", the data I/O circuit 205 may output the first write data DIN1, which are stored therein, based on the write command WT which is activated. At the point in time "T25", the data I/O circuit 205 may inhibit the internal data ID from being input to the data I/O circuit 205 based on the data strobe signal DQS which is non-toggled.

At the point in time "T25", the defect detection circuit 211 may compare a logic level combination of the first write data DIN1 with a logic level combination of the pattern data PD.

At a point in time "T27", the defect detection circuit 211 may generate the detection signal DET which is activated when the first write data DIN1 and the pattern data PD have different logic level combinations.

At a point in time "T29", the internal command generation circuit 201 may generate the test read command TCMD2 which is activated based on the command/address signal CA having a logic level combination for outputting the test flag signal TD.

At the point in time "T29", the defect detection circuit 211 may generate the test flag signal TD which is activated based on the test read command TCMD2 which is activated and the detection signal DET.

FIG. 11 is a table illustrating various operations performed in the normal mode and the test mode of the second electronic device 120 illustrated in FIG. 2. Referring to FIG. 11, the second electronic device 120 may perform various internal operations in the normal mode when the test command TCMD1 Is inactivated to have a logic "low(L)" level. The second electronic device 120 may perform the read training operation when the internal command ICMD is activated to have a logic "high(H)" level in the normal mode. The second electronic device 120 may perform the read operation when the read command RD is activated to have a logic "high(H)" level in the normal mode. The second electronic device 120 may perform the write operation when the write command WT is activated to have a logic "high (H)" level in the normal mode.

The second electronic device 120 may perform a first test operation and a second test operation in the test mode when the test command TCMD1 is activated to have a logic "high(H)" level. The second test operation may be performed after the first test operation is performed. That is, the first test operation and the second test operation may be sequentially and successively performed.

The second electronic device 120 may transmit the pattern data PD through a path including the data pad array 213 to enter the first test operation for storing the pattern data PD as the write data DIN when the internal command ICMD is activated to have a logic "high(H)" level in the test mode. Thereafter, the second electronic device 120 may store the write data DIN into the memory cell array as the stored data when the write command WT is activated to have a logic "high(H)" level. The second electronic device 120 may compare the write data DIN with the pattern data PD to generate and store the test flag signal TD when the write command WT is activated to have a logic "high(H)" level in the test mode. The second electronic device 120 may maintain the read command RD inactivated to have a logic "low(L)" level while the first test operation is performed. Thus, the second electronic device 120 may detect defects of a path through which data are transmitted between the data pad array 213 and the data I/O circuit 207 when the first test operation is performed.

The second electronic device 120 may output the stored data in the memory cell array as the read data DOUT during the first test operation when the read command RD has a logic "high(H)" level in the test mode and may transmit the read data DOUT through a path including the data path array 213 to enter the second test operation for restoring the read data DOUT as the write data DIN. Thereafter, the second electronic device 120 may compare the write data DIN with the pattern data PD to generate and store the test flag signal TD when the write command WT is activated to have a logic "high(H)" level in the test mode. The second electronic device 120 may maintain the internal command ICMD inactivated to have a logic "low(L)" level while the second test operation is performed. Thus, the second electronic device 120 may detect defects of a path through which data are transmitted between the data pad array 213 and the memory cell array when the second test operation is performed.

Figure 12:
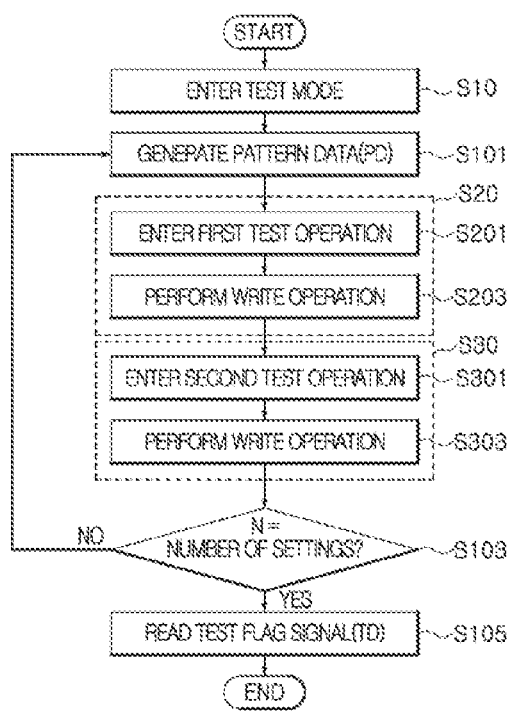
FIG. 12 is a flowchart illustrating a method of executing a test operation of the second electronic device illustrated in FIG. 2.

FIG. 12 is a flowchart illustrating a method of performing the test operation of the second electronic device 120 illustrated in FIG. 2. As illustrated in FIG. 12, the method of performing the test operation of the second electronic device 120 may include a step of entering the test mode (see a step S10), a step of generating the pattern data PD (see a step S101), a step of performing the first test operation (see a step S20), a step of performing the second test operation (see a step S30), a step of determining whether a process has to be fed back to a previous step (see a step S103), and a step of outputting the test flag signal TD (see a step S105).

At the step S10 of entering the test mode, the internal command generation circuit 201 may activate the test command TCMD1 to enter the test mode based on the command/address signal CA.

At the step S101 of generating the pattern data PD, the pattern data generation circuit 203 may generate the pattern data PD having a serial pattern based on the command/address signal CA.

The step S20 of performing the first test operation may include a step S201 of entering the first test operation and a step S203 of performing the write operation. At the step S20 of performing the first test operation, the second electronic device 120 may transmit the pattern data PD through a path including the data pad array 213 based on the data strobe signal DQS and the internal command ICMD to store the pattern data PD as the write data DIN for the write operation. The second electronic device 120 may output the write data DIN, which are stored therein, based on the write command WT for the write operation. The second electronic device 120 may store the write data DIN output based on the write command WT for the write operation into the memory cell array as the stored data. The second electronic device 120 may compare the write data DIN with the pattern data PD based on the test command TCMD1 and the write command WT to generate and store the test flag signal TD.

At the step S201 of entering the first test operation, the internal command generation circuit 201 may activate the internal command ICMD based on the command/address signal CA. The data I/O circuit 205 may output the pattern data PD as the internal data ID, which is transmitted to the data pad array 213, based on the data strobe signal DQS and the internal command ICMD and may receive the internal command ID from the data pad array 213 to store the internal command ID as the write data DIN.

At the step S203 of performing the write operation, the internal command generation circuit 201 may activate the write command WT based on the command/address signal CA. The data I/O circuit 205 may output the write data DIN, which are stored at the step S201 of entering the first test operation, based on the write command WT. The core circuit 215 may store the write data DIN, which are output based on the write command WT, into the memory cell array as the stored data. The defect detection circuit 211 may compare a logic level combination of the write data DIN with a logic level combination of the patter data PD based on the test command TCMD1 and the write command WT to generate and store the test flag signal TD.

The step S30 of performing the second test operation may include a step S301 of entering the second test operation and a step S303 of performing the write operation. At the step S30 of performing the second test operation, the second electronic device 120 may output the stored data in the memory cell array as the read data DOUT based on the read command RD for the read operation during the first test operation. The second electronic device 120 may transmit the read data DOUT through a path including the data path array 213 to restore the read data DOUT as the write data DIN for the write operation, based on the data strobe signal DQS and the read command RD. The second electronic device 120 may output the write data DIN, which are restored, based on the write command WT for the write operation. The second electronic device 120 may compare the write data DIN with the pattern data PD based on the test command TCMD1 and the write command WT to generate and store the test flag signal TD.

At the step S301 of entering the second test operation, the internal command generation circuit 201 may activate the read command RD for the read operation based on the command/address signal CA. The core circuit 215 may output the stored data, which are stored into the memory cell array during the first test operation, based on the read command RD. The data I/O circuit 205 may output the read data DOUT as the internal data ID, which is transmitted to the data pad array 213, based on the data strobe signal DQS and the read command RD and may receive the internal command ID from the data pad array 213 to restore the internal command ID as the write data DIN.

At the step S303 of performing the write operation, the internal command generation circuit 201 may activate the write command WT for the write operation based on the command/address signal CA. The data I/O circuit 205 may output the write data DIN, which are restored at the step S301 of entering the second test operation, based on the write command WT. The defect detection circuit 211 may compare a logic level combination of the write data DIN with a logic level combination of the patter data PD based on the test command TCMD1 and the write command WT to generate and store the test flag signal TD.

At the step S103 of determining whether a process has to be fed back to a previous step, the number of times "N" that each of the first and second test operations are performed may be compared with a predetermined number of times to determine whether the first and second test operations have to be additionally performed. The predetermined number of times may be set as a natural number. When the number of times "N" is less than the predetermined number of times, the process may be fed back to the step S101 of generating the pattern data PD such that the pattern data generation circuit 203 generates the pattern data PD having a pattern which is different from a pattern of the pattern data PD used during the first and second test operations performed previously.

At the step S105 of outputting the test flag signal TD, the internal command generation circuit 201 may activate the test read command TCMD2 for outputting the test flag signal TD. When the execution number of times "N" of the first and second test operations is equal to the predetermined number of times, the defect detection circuit 211 may output the test flag signal TD, which is stored during the first and second test operations, based on the test read command TCMD2.

As described above, the second electronic device 120 may transmit the pattern data PD having a serial pattern to a path including the data pad array 213 in the test mode to store the pattern data PD as the write data DIN and may compare the write data DIN with the pattern data PD when the write operation is performed. As a result, it may be possible to improve the ability of detecting defects which are generated on a data I/O path including the data pad array 213.

What is claimed is:

1. An electronic device comprising:
    an internal command generation circuit configured to receive a command and address (command/address) signal to generate a read command, a write command and internal command;
    a pattern data generation circuit configured to generate pattern data based on the command/address signal; and
    a data input and output (input/output) (I/O) circuit configured to operate in response to the read command, the write command and the internal command, and the data I/O circuit configured to selectively receive one of read data from a core circuit and the pattern data from the pattern generation circuit to generate internal data based on the read command and the internal command and output write data, based on the write command, according to the internal data input to the data I/O circuit after the internal data has been transmitted through a path including a data pad array.

2. The electronic device of claim 1,
    wherein the pattern data include a first bit and a second bit having a serial sequence; and
    wherein the first bit has a logic level which is different from a logic level of the second bit.

3. The electronic device of claim 1, wherein the data I/O circuit includes:

a data output circuit configured to output the pattern data or the read data as the internal data to the data pad array in synchronization with a data strobe signal; and a data input circuit configured to receive the internal data from the data pad array based on the data strobe signal.

4. The electronic device of claim 3, wherein the data output circuit includes:
   a data selection circuit configured to output the pattern data as selected data when the internal command is activated and configured to output the read data as the selected data when the read command is activated; and
   an internal data output circuit configured to output the selected data as the internal data in synchronization with the data strobe signal,
   wherein the data strobe signal is toggled during a certain period after a read latency period when one of the internal command and the read command is activated.

5. The electronic device of claim 3, wherein the data input circuit includes:
   an internal data input circuit configured to output the internal data as internal write data in synchronization with the data strobe signal; and
   a write data storage circuit configured to receive the internal write data to store the internal write data as the write data and configured to output the write data, which are stored in the write data storage circuit, based on the write command.

6. The electronic device of claim 5, wherein the data strobe signal is non-toggled when the write command is activated.

7. The electronic device of claim 1, further comprising a defect detection circuit configured to generate a test flag signal by comparing the write data with the pattern data.

8. The electronic device of claim 7,
   wherein the test flag signal has a first logic level when the write data and the pattern data have the same logic level combination; and
   wherein the test flag signal has a second logic level when the write data and the pattern data have different logic level combinations.

9. The electronic device of claim 7, wherein the defect detection circuit includes:
   a detection signal generation circuit configured to compare a logic level combination of the write data with a logic level combination of the pattern data to generate a detection signal during the write operation; and
   a test flag generation circuit configured to generate and store the test flag signal based on the detection signal and configured to output the test flag signal, which is stored in the test flag generation circuit.

10. An electronic device comprising:
    a core circuit configured to output read data;
    a pattern data generation circuit configured to generate pattern data based on a command and address (command/address) signal;
    a data input and output (input/output) (I/O) circuit configured to output the pattern data as internal data based on an internal command or output the read data as the internal data based on a read command, and configured to receive the internal data which are transmitted through a path including a data pad array through which external data are input or output and output the internal data, as write data based on a write command; and
    a defect detection circuit configured to generate a test flag signal by comparing the write data with the pattern data in a test mode.

11. The electronic device of claim 10,
    wherein the pattern data include a first bit and a second bit having a serial sequence; and
    wherein the first bit has a logic level which is different from a logic level of the second bit.

12. The electronic device of claim 10, wherein the data I/O circuit includes:
    a data output circuit configured to output the pattern data or read data as the internal data in synchronization with a data strobe signal; and
    a data input circuit configured to receive the internal data from the data pad array based on the data strobe signal.

13. The electronic device of claim 12, wherein the data input circuit includes:
    an internal data input circuit configured to output the internal data as internal write data in synchronization with the data strobe signal; and
    a write data storage circuit configured to receive the internal write data to store the internal write data as the write data and configured to output the write data, which are stored therein, based on the write command,
    wherein the data strobe signal is toggled.

14. The electronic device of claim 10,
    wherein the test flag signal has a first logic level when the write data and the pattern data have the same logic level combination; and
    wherein the test flag signal has a second logic level when the write data and the pattern data have different logic level combinations.

15. The electronic device of claim 10, wherein the defect detection circuit includes:
    a detection signal generation circuit configured to compare a logic level combination of the write data with a logic level combination of the pattern data to generate a detection signal during the write operation; and
    a test flag generation circuit configured to generate and store a test flag signal based on the detection signal and configured to output the test flag signal, which is stored in the test flag generation circuit.

16. A method of performing a test operation, the method comprising:
    generating pattern data based on a command and address (command/address) signal; and
    performing a test operation for selecting the pattern data or read data stored at a core circuit as write data by transmitting the pattern data or the read data through a path including a data pad array based on an internal command and a read command and for generating a test flag signal by comparing the write data with the pattern data based on a test command and a write command.

17. The method of claim 16, wherein performing the test operation includes:
    entering a first test operation by outputting the pattern data as internal data, which are transmitted to the data pad array, based on the internal command and by receiving the internal data from the data pad array to store the internal data as the write data; and
    performing the write operation for generating the test flag signal by comparing a logic level combination of the write data with a logic level combination of the pattern data based on the test command and the write command.

18. The method of claim 16, further comprising performing a second test operation for outputting stored data, which are stored into a memory cell array during the first test operation, as the read data based on the read command, for restoring the read data as the write data by transmitting the read data through a path including the data pad array based on the read command, and for generating the test flag signal by comparing the write data with the pattern data based on the test command and the write command.

19. The method of claim 18, wherein performing the second test operation includes:
   entering the second test operation by outputting the stored data, which are stored into the memory cell array during the first test operation, as the read data based on the read command, by outputting the read data as internal data, which are transmitted to the data pad array, based on the read command, and by receiving the internal data from the data pad array to restore the internal data as the write data; and
   performing the write operation for generating the test flag signal by comparing a logic level combination of the write data with a logic level combination of the pattern data based on the test command and the write command.

20. The method of claim 18, further comprising:
   comparing the execution number of times of each of the first and second test operations with a predetermined number of times to determine whether the first and second test operations have to be additionally performed; and
   outputting the test flag signal, which is stored during the first and second test operations, based on a test read command when the execution number of times of each of the first and second test operations is equal to the predetermined number of times,
   wherein when the execution number of times of the first or second test operation is less than the predetermined number of times, the pattern data generated at the step of generating the pattern data have a pattern which is different from a pattern of the pattern data used during the first and second test operations performed previously.

* * * * *